350-320 CROSS REFERENCE SEARCH ROOM

April 28, 1970 E. B. SHEARIN, JR 3,508,982

METHOD OF MAKING AN ULTRA-VIOLET SELECTIVE TEMPLATE

Filed Jan. 3, 1967

INVENTOR.
ELMO B. SHEARIN, JR.
BY Arthur L. Lessler
ATTORNEY

United States Patent Office
3,508,982
Patented Apr. 28, 1970

3,508,982

METHOD OF MAKING AN ULTRA-VIOLET SELECTIVE TEMPLATE

Elmo B. Shearin, Jr., Riviera Beach, Fla., assignor to International Telephone and Telegraph Corporation, a corporation of Delaware Filed Jan. 3, 1967, Ser. No. 607,048
Int. Cl. G02b; C23f *1/02;* B44c *1/22*
U.S. Cl. 156—3 10 Claims

ABSTRACT OF THE DISCLOSURE

A mask used for photoprocessing of semiconductor devices. The mask is employed in conjunction with photoresists which are sensitive to ultraviolet radiation. The mask comprises a substrate of glass which is transparent to both visible and ultraviolet light, one surface of the substrate being coated with a layer of silicon monoxide. The silicon monoxide layer has relatively thick portions, in accordance with a desired pattern, which are substantially opaque to ultraviolet light, and relatively thin portions which are substantially transparent to ultraviolet light. The entire silicon monoxide layer is substantially transparent to visible light.

RELATED APPLICATIONS

Figure 1A:
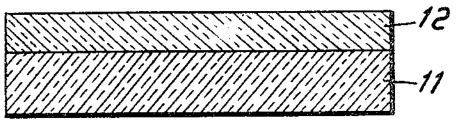
Figure 1B:
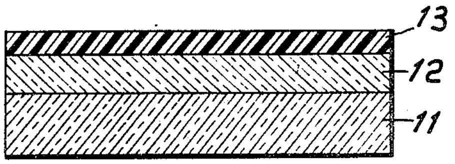
Figure 1C:
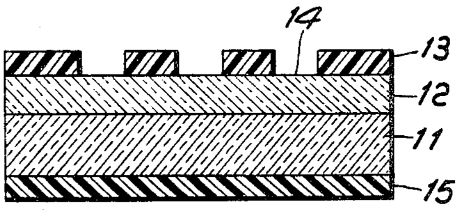
Figure 1D:
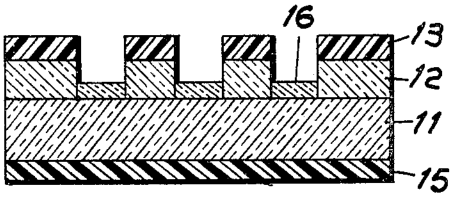
Figure 1E:
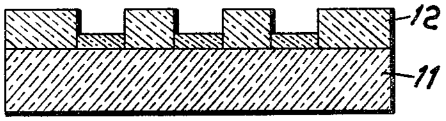

The subject matter of this invention is related to that of copending U.S. patent application S.N. 611,746, filed in the name of G. D. Frankson and assigned to the assignee of the instant application.

BACKGROUND OF THE INVENTION

This invention relates to improvements in microcircuit manufacturing techniques, and more particularly to an improved process for photoetching of diffusion, deposition and etching masks used in conjunction with such manufacturing techniques.

Presently employed techniques for the manufacture of monolithic integrated circuits, thin film circuits, and other types of microcircuits employ a number of selective diffusion and selective deposition operations, said operations being carried out by means of a suitable mask deposited on the microcircuit surface which is to be subjected to the particular operation to be performed. This mask is generally made by depositing a layer of photoresist on the surface to be masked, and subsequently photoetching the photoresist masking layer. The photoresist is typically a material sensitive to ultraviolet light and exposure is accomplished by a contact printing process employing a suitable printing template in direct contact with the photoresist masking layer.

This contact printing of the photoresist masking layer is necessitated by the required high resolution and close tolerances of the resultant diffusion or deposition mask. The contact printing template in most widespread use at the present time comprises a glass slide which has been coated on one surface thereof with a photosensitive emulsion and subsequently etched so that a pattern corresponding to that of the desired mask to be formed is produced by selective removal of portions of said emulsion. The contact printing process is then carried out by placing the glass slide on the surface to be masked so that the emulsion template is in direct contact with the photoresist masking layer. Due to abrasion between the emulsion template and the photoresist masking layer, the template becomes rapidly degraded and is usable only a limited number of times (on the order of ten applications) before it must be discarded if the required resolution and tolerances are to be maintained.

An alternative template presently being employed in microcircuit manufacture is the so-called "hard" type, employing a metal coating (typically chrome) on a glass substrate. The metal coating is substantially harder than the photoresist emulsion and therefore has greater resistance to abrasion and a usable life substantially greater than that of the conventional photoresist template. In addition, the greater mechanical and thermal stability of the metal template permits attainment of improved resolution and tolerances.

A disadvantage of the "hard" template is the relatively high expense of fabrication in comparison with the conventional photoresist template.

In the manufacture of monolithic integrated circuits. several consecutive diffusion and/or deposition steps are usually required to be carried out on the same surface. In such applications, it is therefore necessary to achieve extremely accurate alignment of each template with respect to the surface in order to assure proper registration of the various diffused and deposited areas subsequently formed in conjunction with corresponding masking layers deposited on said surface. Since a large portion of the areas of both the conventional photoresist template and the metallic "hard" template are opaque to visible light-alignment of the template with the underlying surface is generally a tedious and difficult process.

The aforementioned copending application of G. D. Frankson is directed to a photomask comprising a substrate transparent to both visible and ultraviolet light, and a layer of silicon monoxide deposited on one surface of the substrate in accordance with a desired pattern. The silicon monoxide layer is substantially transparent to visible light but opaque to ultraviolet light. It has been discovered however, that while the use of silicon monoxide as a masking material is advantageous, the particular structure of the mask disclosed by Frankson and the method of fabrication thereof possess certain disadvantages, as will be hereinafter described.

Accordingly, an object of the present invention is to provide an improved process for the fabrication of diffusion and/or deposition masks on microcircuits.

Another object of the invention is to provide an improved process for the fabrication of photomasks wherein alignment of the template with the surface to be masked is greatly facilitated.

SUMMARY

These and other objects which will become apparent by reference to the following detailed description taken in conjunction with the accompanying drawing and appended claims, are achieved by (i) utilization of a transparent template having a silicon monoxide film selectively deposited on one surface thereof in a pattern of relatively thick and relatively thin film regions corresponding to that of the desired diffusion and/or deposition mask to be formed, and (ii) exposing the photoresist masking layer on the microcircuit surface to be masked to ultraviolet light through said template. The silicon monoxide template, being transparent to visible light, greatly facilitates alignment thereof with the surface to be masked. The silicon monoxide template is substantially harder than the conventional photoresist emulsion template and therefore has considerably greater useful life. Since a sufficiently thick layer of silicon monoxide absorbs ultraviolet light, however, it is completely effective as a photomask for the underlying ultraviolet light-sensitive photoresist masking layer deposited on the surface to be processed.

THE DRAWING

The drawing shows the steps involved in fabricating a silicon monoxide mask according to the invention.

DETAILED DESCRIPTION

The technique for making a silicon monoxide photomask as described in the copending application of G. D. Frankson, is utilizable only for the manufacture of photomasks having relatively non-critical resolution requirements. The resolution obtainable by the aforementioned manufacturing process is limited by the fact that the portions of the silicon monoxide layer overlying the aluminum-covered areas of the glass substrate do not break off cleanily when these aluminum portions are removed. As a result, the remaining portions of the silicon monoxide coating are non-uniform and have ragged edges. In extreme cases, large parts of the silicon monoxide film portions may break off when the adjacent areas of the silicon monoxide film are removed.

A high quality glass substrate 11, which may typically be on the order of two inches square by approximately 1/32 inch thick, is coated with a thin coating of silicon monoxide 12, as shown at A in the drawing. The glass substrate 11 should preferably be extremely homogeneous and possess a high quality surface of good smoothness and uniformity. In addition, it is essential that the substrate 11 be substantially transparent to both visible and ultraviolet light.

The silicon monoxide coating 12 should preferably have a thickness between 1.5 and 2.5 microns. The thickness of this coating is not critical but should exceed a minimum value on the order of 1.5 microns to insure sufficient opacity to ultraviolet light. The coating 12 may be vacuum deposited by placing the substrate 11 in an electron beam evaporator adjacent to a quantity of silicon monoxide pellets, and subsequently irradiating the pellets with an electron beam at a pressure of approximately $4.0 \times 10^{-6}$ torr. The deposition process should be continued until the desired film thickness is obtained.

The coated substrate 11 is then placed on a spinner and coated with a thin layer 13 of Kodak KTFR photoresist. This is a "negative" photoresist, i.e. a photoresist which undergoes polymerization in the areas exposed to ultraviolet light; the polymerized areas are resistant to a particular developer solution, while the unexposed areas are soluble therein—the net result being that those areas which have not been irradiated are removed during the developing process. The substrate 11 may be spun at approximately 10,000 r.p.m. for about 12 seconds, resulting in a photoresist film thickness on the order of one micron. Where especially high resolution is required (on the order of 0.2 mil or better), thinner photoresist layers may be employed.

The photoresist layer 13 is subsequently exposed to ultraviolet light through a suitable master photoplate, to polymerize selected portions of said layer. After exposure, the non-polymerized portions of the photoresist layer 13 are removed by spraying said layer with Stoddard solvent and subsequently rinsed in N-butyl acetate. The developed photoresist film is then cured by baking at approximately 95° C. for about 15 minutes. The next step involves coating the opposite surface of the glass substrate 11 with a protective layer 15 of material impervious to the silicon monoxide etchant to be subsequently employed. Preferably, a thin film of Krylon (a trademark of Krylon, Inc.), an aerosol spray of a solution of acrylic ester resin, which may be sprayed on should be employed where a hydrofluoric acid solution is utilized as the silicon monoxide etchant.

The coated substrate 11, as shown at C, is immersed in a solution of hydrofluoric acid buffered with ammonium fluoride. Preferably, the solution should be comprised of 3000 parts of 49% ammonium fluoride and 245 parts of 40% hydrofluoric acid. As a result of immersion in this etchant, the portions 16 of the silicon monoxide film not protected by the photoresist layer 12 will be reduced in thickness, the amount of thickness reduction being dependent on the time the substrate is immersed in the etchant solution. The etching time should be controlled so that the etched portions 16 of the silicon monoxide film are reduced to a minimal thickness sufficiently small so that these portions become substantially transparent to ultraviolet light.

Preferably, a film thickness on the order of 500 angstroms is desirable for these etched portions. Where the aforementioned etching solution is employed, the substrate 11 should be immersed in the etchant for a time on the order of 35 to 40 minutes when the initial thickness of the silicon monoxide coating 12 is 2.5 microns. The reason the portions 16 of the silicon monoxide film are not completely removed, is to prevent dissolution and deterioration of the underlying substrate by the hydrofluoric acid.

After the etching operation is completed, the Krylon film 15 is removed with acetone and the photoresist layer 13 is removed by immersion in a series of solutions comprising (1) a product designated as J–100 by Indust-Ri-Chem Laboratory, Inc.; (2) xylene; and (3) trichloroethylene; this is followed by spraying with isopropyl alcohol and subsequent drying of the processed substrate. The resultant silicon monoxide photomask, as shown at E is now ready for use in the manner previously described.

The relatively thick portions of the silicon monoxide layer 12, although substantially transparent to visible light, have an ultraviolet absorption characteristic extending, well into the blue end of the visible spectrum, thus giving these relatively thick layer portions a characteristic brownish tint. The transparency of the silicon monoxide layer 12 as well as the substrate 11 to visible light greatly facilitates the alignment of the template with suitable markings on the photoresist-coated microcircuit wafer to be processed, while the characteristic brownish tint of the relatively thick portions of the silicon monoxide layer enables visible differentiation from the glass substrate 11.

The microcircuit to be processed, after being coated with a suitable ultraviolet sensitive conventional (negative) photoresist, is then covered with the template shown at E so that the silicon monoxide layer 12 is in contact with the photoresist masking layer.

The conventional photoresist masking layer is then exposed to ultraviolet light through the silicon monoxide template. After exposure, the masking layer is developed by immersion in a suitable solvent which dissolves those areas not irradiated by the ultraviolet light. The resultant photoresist mask may then be utilized in connection with conventional vapor phase or solid diffusion, selective deposition or etching processes.

While the principles of the invention have been described above in connection with specific embodiments, and particular modifications thereof, it is to be clearly understood that this description is made only by way of example and not as a limitation on the scope of the invention.

I claim:

1. A method of forming a template on a substrate, said substrate being transparent to both visible and ultraviolet light, comprising tht steps of:, depositing a layer of silicon monoxide over one surface of said substrate, said deposition continuing until said layer is sufficiently thick to be opaque to ultraviolet light while being transparent to visible light; and reducing the thickness by etching of a selected portion of said layer until said selected portion becomes transparent to ultraviolet light while the non-selected portion of said layer remains opaque to ultraviolet light.

2. A process according to claim 1 wherein said reducing step is performed by selective etching comprising:

applying an overlying layer of photoresist material to said silicon monoxide coating, said photoresist being impervious to a particular silicon monoxide etchant;

photoetching said photoresist layer to remove parts thereof corresponding to said desired pattern; and subjecting said silicon monoxide coating to said etchant for a time such that the exposed parts of said silicon monoxide coating are reduced to a minimal thickness such that such exposed parts exhibit substantial transmissibility to ultraviolet light.

3. A process according to claim 2, wherein the thickness of said selected portions is on the order of 500 angstrom units.

4. A process according to claim 2 wherein prior to said silicon monoxide etching step the other surface of said substrate is coated with a protective layer of a substance impervious to said etchant.

5. A process according to claim 1, wherein the thickness of the non-selected portions is between 1.5 and 2.5 microns.

6. A method of forming a silicon monoxide template on a glass substrate, said substrate being transparent to both visible and ultraviolet light, comprising the steps of:

depositing a layer of silicon monoxide over one surface of said substrate, said deposition continuing until said layer is sufficiently thick to be opaque to ultraviolet light while being transparent to visible light;

forming a pattern with photoresist material over said layer leaving areas of said layer exposed in accordance with the desired template pattern, said photoresist material being impervious to a particular silicon monoxide etchant;

coating the substrate surface opposite said one surface with a resist material, said resist material being impervious to said etchant; and immersing said exposed layer of silicon monoxide in a solution of hydrofluoric acid buffered with ammonium fluoride to partially etch through said silicon monoxide layer to reduce the thickness of said exposed layer until said exposed layer becomes transparent to ultraviolet light.

7. A process according to claim 6 wherein said solution is comprised of 3,000 parts of 49% ammonium fluoride and 245 parts of 40% hydrofluoric acid.

8. A process according to claim 6 wherein the thickness of said deposited layer is between 1.5 and 2.5 microns.

9. A process according to claim 6 wherein the thickness of said partially etched layer is on the order of 500 angstrom units.

10. A process according to claim 1, wherein said substrate is glass.

References Cited

UNITED STATES PATENTS 3,089,793 5/1963 Jordan et al. ------- 156—17 XR

JACOB H. STEINBERG, Primary Examiner

U.S. Cl. X.R.

96—27, 36.2, 38.3; 156—17; 161—2; 350—320